United States Patent [19]

Nakatsugawa et al.

[11] Patent Number: 4,797,936
[45] Date of Patent: Jan. 10, 1989

[54] WAVEFORM SEQUENCE TRIGGER SYSTEM

[75] Inventors: Kenji Nakatsugawa, Kanagawa; Aiichi Katayama, Isehara; Hitoshi Sekiya; Shoji Hiratsuka, both of Atsugi, all of Japan

[73] Assignee: Anritsu Corporation, Tokyo, Japan

[21] Appl. No.: 120,729

[22] Filed: Nov. 16, 1987

Related U.S. Application Data

[63] Continuation of Ser. No. 786,243, Oct. 9, 1985.

[30] Foreign Application Priority Data

Oct. 15, 1984 [JP] Japan .................. 59-215861

[51] Int. Cl.$^4$ .................................. G06K 9/00
[52] U.S. Cl. ........................... 382/1; 382/34; 324/73 R; 364/487; 364/580
[58] Field of Search ............. 324/73 R, 77 R, 78 R; 340/146.2; 358/166; 364/481, 487, 579, 580; 382/1, 33, 3 A, 42, 50, 54, 18, 51

[56] References Cited

U.S. PATENT DOCUMENTS

| | | | |
|---|---|---|---|
| 4,003,024 | 1/1977 | Riganati et al. | 358/166 |
| 4,100,532 | 7/1978 | Farnbach | 364/481 |
| 4,142,146 | 2/1979 | Schumann et al. | 364/487 |
| 4,164,728 | 8/1979 | Marsh | 382/34 |
| 4,250,562 | 2/1981 | Haag et al. | 364/900 |
| 4,425,643 | 1/1984 | Chapman et al. | 324/73 R |
| 4,592,369 | 6/1986 | Davis et al. | 324/77 R |
| 4,641,348 | 2/1987 | Neuder et al. | 382/1 |
| 4,651,341 | 3/1987 | Nakashima et al. | 382/34 |
| 4,697,138 | 9/1987 | Morishita et al. | 324/73 R |
| 4,701,918 | 10/1987 | Nakajima et al. | 324/73 R |

Primary Examiner—Leo H. Boudreau
Assistant Examiner—Jose L. Couso
Attorney, Agent, or Firm—Frishauf, Holtz Goodman & Woodward

[57] ABSTRACT

A digital signal processing apparatus has: an A/D converter for A/D converting an input signal to be processed to a digital signal, an analog comparator for comparing the input signal with a predetermined threshold voltage and generating a comparison signal as a binary signal, a first input device for inputting at least binary data of a reference wave to be triggered, a discriminator for discriminating a coincidence between the binary signal from the analog comparator and the binary data entered at the first input device and generating a coincidence signal, a fetching section, triggered in response to the coincidence signal from the discriminator, for fetching the digital signal from the A/D converter, and a processor for performing predetermined processing of the digital signal fetched by the fetching device.

10 Claims, 4 Drawing Sheets

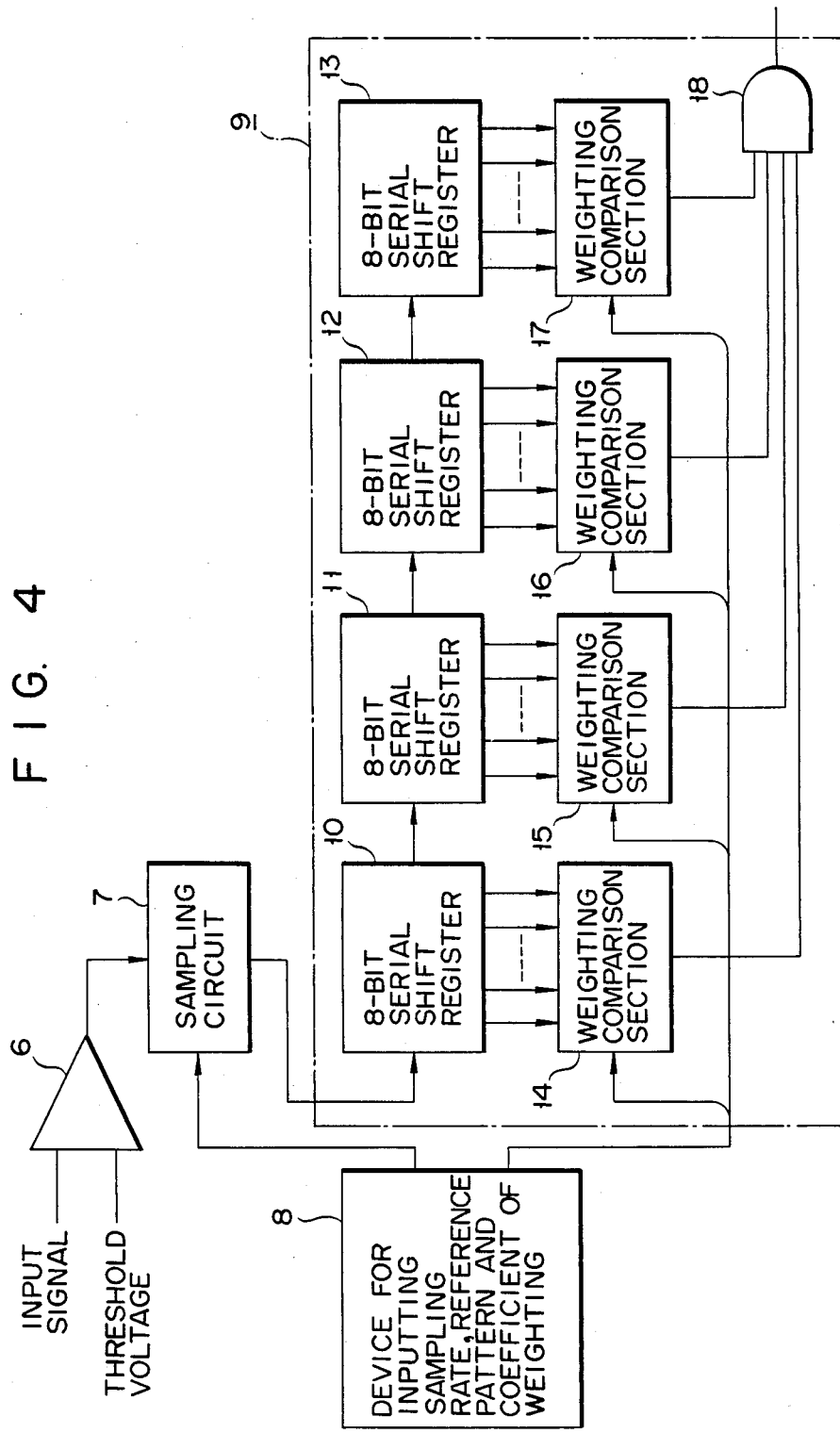

WAVEFORM SEQUENCE TRIGGER SYSTEM

This application is a continuation of application Ser. No. 786,243, filed Oct. 9, 1985.

BACKGROUND OF THE INVENTION

This invention relates to a digital signal processing apparatus and, more particularly, to a digital signal processing apparatus having a trigger means for extracting a specific signal from signals with amplitude, pulse width, period or the like varying along the time base in a complex manner.

A conventional digital oscilloscope as a digital wave observation apparatus adapting digital signal processing techniques is illustrated in FIG. 1. Reference numeral 101 denotes a trigger generator. In the generator 101, a trigger level preset by a volume control 102 is compared by an analog comparator 103 with an input signal. When the input signal is larger than the trigger level preset by the control 102, the trigger signal is generated by the generator 101. The trigger signal is supplied to a signal fetching controller 104. The controller 104 generates a data fetch control signal to a wave memory 106 in response to the trigger signal. Wave data of the input signal converted by an A/D converter 105 is stored in the wave memory 106. The wave data of the input signal stored in the memory 106 is read out under the control of a display controller 107 and is displayed on a display 108.

FIG. 2 shows a waveform for explaining how a trigger signal is generated in the oscilloscope of FIG. 1. In this case, a waveform portion I is triggered with level L.

For this reason, a waveform portion II surrounded by the broken rectangle of FIG. 2 is triggered with another signal wave. In other words, the desired portion II cannot be triggered at a desired moment. As a result, the desired wave cannot be observed, resulting in inconvenience.

This is because the input signal is stored in the wave memory 106 at the predetermined trigger level L although the amplitude, width and period of the input signals vary along the time base in a complex manner.

SUMMARY OF THE INVENTION

It is an object of the present invention to solve the conventional problem described above and to provide a digital signal processing apparatus wherein a desired wave to be triggered is represented by binary data consisting of a bit string of "1" and "0" signals, and an input signal is triggered and stored in a memory when the input signal has the same wave as a reference wave.

According to the present invention, there is provided a digital signal processing apparatus comprising:
an A/D converter for A/D converting an input signal to be processed to a digital signal;
analog comparing means for comparing the input signal with a predetermined threshold voltage and generating a comparison signal as a binary signal;
input means for inputting at least binary data of a reference wave to be triggered;
discriminating means for discriminating a coincidence between the binary signal from the analog comparing means and the binary data entered at the input means and generating a coincidence signal;
fetching means, triggered in response to the coincidence signal from the discriminating means, for fetcing the digital signal from the A/D converter; and
processing means for performing predetermined processing of the digital signal fetched by the fetching means.

BRIEF DESCRIPTION OF THE DRAWINGS

These and other objects and features of the present invention can be understood by reference to the accompanying drawings, in which:

FIG. 4 is a block diagram of a pattern trigger circuit of FIG. 3;

DETAILED DESCRIPTION OF THE PREFERRED EMBODIMENT

The present invention is exemplified by a pattern trigger type digital oscilloscope as a digital signal processing apparatus according to an embodiment with reference to the accompanying drawings.

Figure 1:
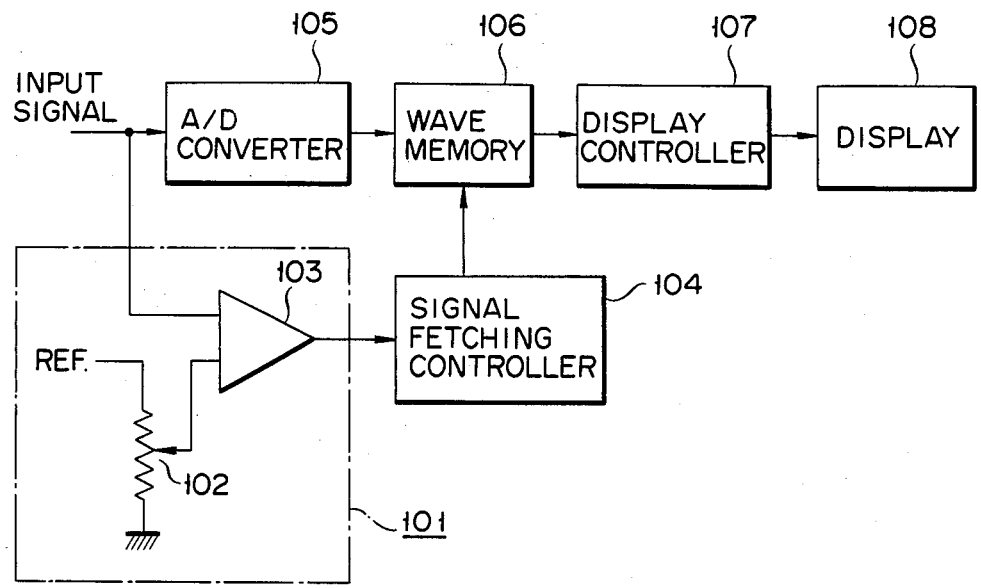
FIG. 1 is a block diagram of a conventional digital oscilloscope.
Figure 2:
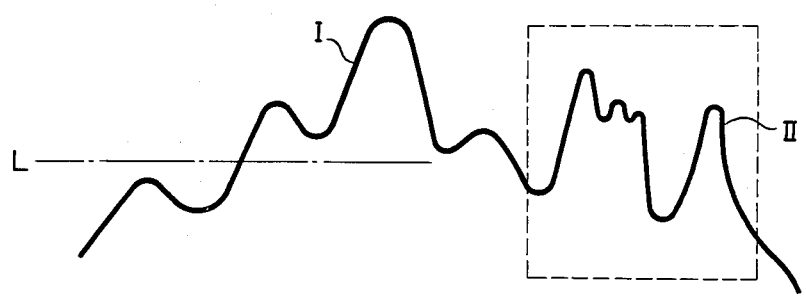
FIG. 2 is a chart for explaining triggering in the oscilloscope of FIG. 1.
Figure 3:
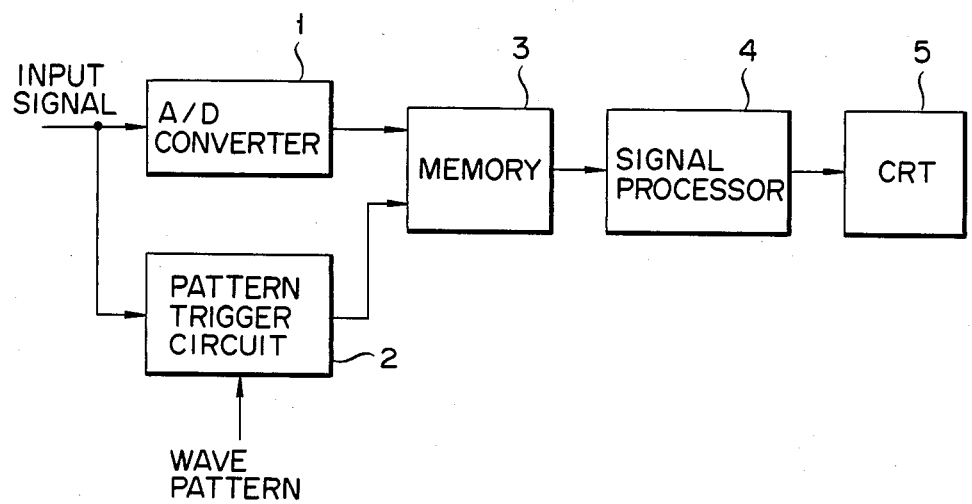
FIG. 3 is a block diagram for a pattern trigger type digital oscilloscope as a digital signal processing apparatus according to an embodiment of the present invention.

Referring to FIG. 3, reference numeral 1 denotes an A/D converter; 2, a pattern trigger circuit; 3, a memory; 4, a signal processor; and 5, a CRT.

An input signal (i.e., a signal to be displayed) is converted by the converter 1 to a digital signal. The input signal is also supplied to the circuit 2. When the pattern of the waveform of the input signal has a correlation with a reference wave pattern preset in the circuit 2 within a predetermined range, the circuit 2 generates a trigger signal. The memory 3 stores the digital signal from the converter 1 in response to the trigger signal from the circuit 2. The wave pattern preset in the circuit 2 is used as trigger data, and the input signal wave data within the predetermined range determined by the triggering delay is stored in the memory 3. Therefore, the desired wave for the observer is stored in the memory 3. The signal wave data are sequentially read out from the memory 3 and are processed by the processor 4. The processed wave data is displayed on the CRT 5.

FIG. 4 shows the arrangement of the pattern trigger circuit in FIG. 3. Referring to FIG. 4, reference numeral 6 denotes an analog comparator; 7, a sampling circuit; 8, an input device; 9, a discriminator; 10 to 13, 8-bit serial shift registers, respectively; 14 to 17, weighting comparison sections, respectively; and 18, an AND gate.

The comparator 6 compares the threshold voltage with the input signal for every predetermined cycle, so that the input signal is generated as a serial signal having two levels of "1" and "0". The serial analog serial from the comparator 6 is supplied to the sampling circuit 7. The sampling circuit 7 generates a digital pattern signal of a sampled input signal in accordance with a present sampling rate supplied thereto. The sampling rate of the sampling circuit 7 is entered at the device 8 such that the circuit 7 is active for low-frequency input pulses but less active for high-frequency input pulses. This is because a large number of bits of the digital pattern signal to be compared do not allow the discriminator 9 (to be described in detail later) to discriminate an identity of the input wave data since the large number of bits represent various characteristics inherent to the wave. The digital pattern signal from the sampling circuit 7 is sequentially supplied to the 8-bit serial shift registers 10, 11, 12 and 13 which are connected in series with each other. The signal is shifted from the register 10 to the register 13 in response to clocks (not shown). The sections 14 to 17 are arranged in correspondence with the registers 10 to 13. The reference pattern data and the coefficient of correlation can be set by the device 8 in each of the sections 14 to 17. The pattern data representing the wave to be triggered by using some or all of the sections 14 to 17 is entered by the device 8 as a ternary signal consisting of "1" and "0" signals and a "don't care" signal (to be described in detail later). When the pattern data representing the wave to be triggered and the digital pattern data supplied from the registers 10 to 13 coincide with each other within the coefficients of the correlation which are set by the device 8 in the sections 14 to 17, the sections 14 to 17 generate coincidence signals of logic "1". When all the outputs from the sections 14 to 17 are set at logic "1", the AND gate 18 generates a signal of logic "1". In this case, the pattern data of the wave subjected to triggering and set by the device 8 in the sections 14 to 17 coincides with the digital pattern data of the input signal at a predetermined coefficient of correlation. In other words, the wave pattern to be triggered is supplied as the input signal to the oscillator. In this manner, the trigger signal is generated by the discriminator 9. The digital input signal from the converter 1 is stored in the memory 3 in response to the trigger signal from the circuit 2 described with reference to FIG. 3.

Figure 5:
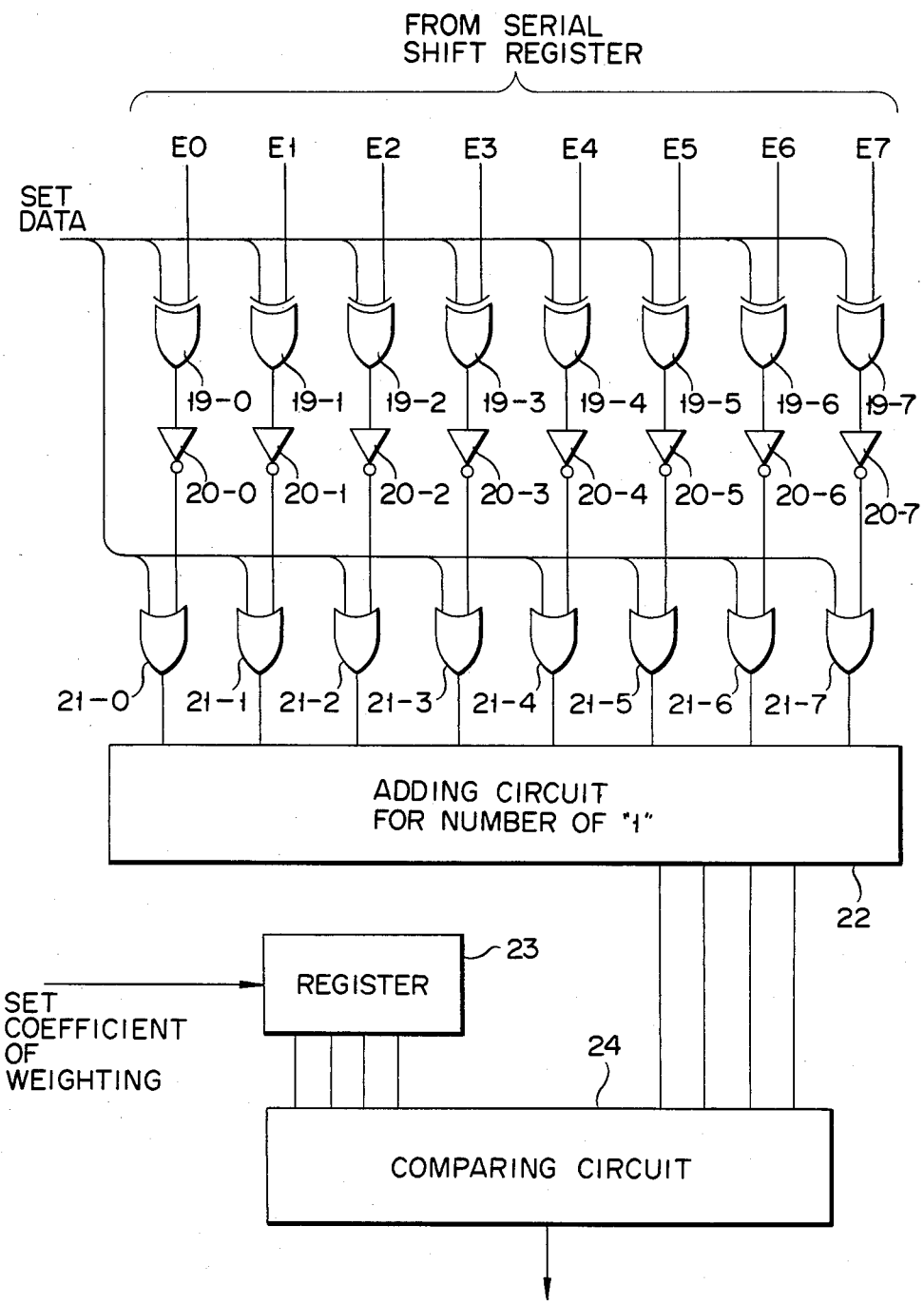
FIG. 5 is a detailed block diagram of a weighting comparison section shown in FIG. 4.

FIG. 5 shows an arrangement of one of the sections 14 to 17. Referring to FIG. 5, reference numerals 19-0 to 19-7 denote exclusive OR gates, respectively; 20-0 to 20-7, inverters, respectively; 21-0 to 21-7, OR gates, respectively; 22, an adding circuit for number of "1"; 23, a register; and 24, a comparing circuit.

Output data E0 to E7 from the registers 10 to 13 are supplied to the first input terminals of the exclusive OR gates 19-0 to 19-7, respectively. The binary data string of "1" and "0" data which represent a wave to be triggered as described above is supplied to the second input terminals of the gates 19-0 to 19-7. Outputs from the gates 19-0 to 19-7 are supplied to the first input terminals of the OR gates 21-0 to 21-7 through the inverters 20-0 to 20-7, respectively. The second input terminals of the OR gates 21-0 to 21-7 commonly receive the "1" signal as the "don't care" signal. When the input to the second input terminals of the OR gates 21-0 to 21-7 is not the "don't care" signal, the input is a "0" signal. The circuit 22 counts the number of "1"s supplied from the OR gate 21-0 to 21-7 thereto and generates a 3-bit count signal. The correlation coefficient data is set in the register 23. The circuit 24 compares the correlation coefficient value M set in the register 23 with the count data N from the circuit 22. When condition $N \geq M$ is established, the circuit 24 generates an output of logic "1".

The operation of the weighting comparison section will be described in more detail hereinafter.

Figure 6:
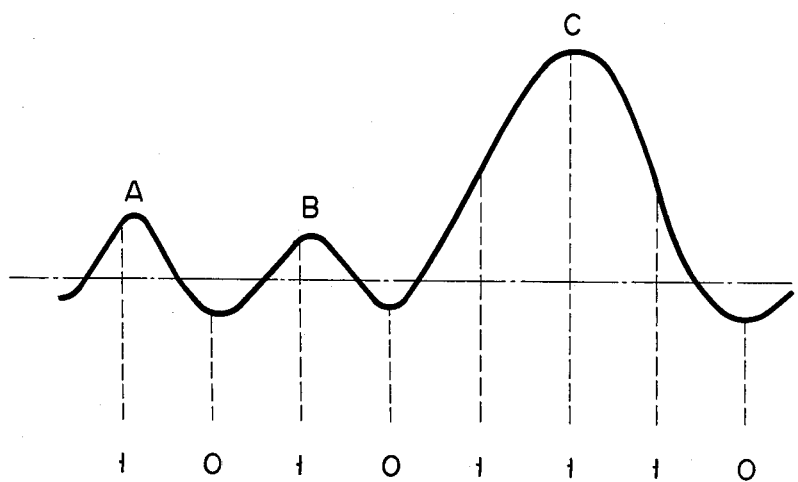
FIG. 6 is a chart for explaining the pattern data and the wave to be triggered in the oscilloscope of FIG. 3.

When triggering is performed with a wave shown in FIG. 6, the bits of the resultant data "10101110" are respectively set in the gates 19-0 to 19-7. When the data E0 to E7 from the corresponding registers 10 to 13 have reached the data "10101110", all the outputs from the gates 19-0 to 19-7 are set at logic "0". The outputs of logic "0" are inverted by the inverters 20-0 to 20-7, and the inverted signals are supplied to the circuit 22 through the OR gates 21-0 to 21-7. The circuit 22 comprises adders and an SN74LS275 known as a "WALLACE TREES" circuit available from Texas Instruments, U.S.A. Since eight "1"s are supplied to the circuit 22, the circuit 22 supplies the count data N=8 to the circuit 24. The correlation coefficient data, e.g., M=8 is preset in the register 23. The data M=8 is also supplied to the circuit 24. The circuit 24 compares the data M=8 with N=8. Since condition $N \geq M$ is established, the circuit 24 generates a signal of logic "1". In other words, the wave pattern subjected to triggering and preset in the gates 19-0 to 19-7 is identified as the wave pattern data supplied to the serial shift registers.

When triggering is performed with a wave C among the waves shown in FIG. 6, the pattern data of the wave C is given as "01110". In this case, bits of the pattern data "01110" of the wave C are stored in the gates 19-3 to 19-7, respectively. Other portions excluding the wave D do not influence triggering, so that the "don't care" signal of logic "1" is set as a weighting coefficient in the OR gates 21-0 to 21-2. All the outputs from the OR gates 21-0 to 21-2 are always set at logic "1". When the data consisting of bits E3 to E7 from the serial shift registers has reached the data "01110", the circuit 22 generates the count data N=8. As a result, the circuit 24 generates a signal of logic "1".

As can be apparent from the above description, the pattern data of the wave to be triggered is stored as a binary data string of "0" and "1" signals in the exclusive OR gates 19-0 to 19-7, and at the same time, the "don't care" signal of logic "1" is stored as the weighting coefficient in the OR gates 21-0 to 21-7, as needed, thereby generating the trigger signal with a desired wave. In the above description, the trigger signal is generated when the correlation coefficient data completely coincides with the count data N=8. However, correlation coefficient data set in the register 23 can be arbitrarily determined. The trigger signal having a wave approximated by the correlation coefficient data set in the register can be generated.

The weighting comparison section shown in FIG. 5 is operated in the manner as described above. As shown in FIG. 4, the 8-bit serial shift registers 10 to 13 are connected in series with each other and to the weighting comparison sections 14 to 17, respectively. Therefore, the wave pattern data and the correlation coefficient data can be set in units of weighting comparison sections. With this arrangement, when the wave shown in FIG. 6 is repeated twice and the subsequent wave is indeterminate, the "don't care" signal can be set in the weighting comparison section corresponding to the 8-bit shift register for storing unnecessary wave data, thereby the weighting comparison section has a maximum flexibility and a redundancy function. For example, parts of the horizontal sync signals of the television signals of different systems are observed, the pattern data common in the respective systems are set, and the "don't care" signal is set in the remaining portions. Therefore, the common wave portions of the horizontal sync signals of the television signals of different systems can be triggered.

In the above embodiments, four 8-bit serial shift registers are connected in series with each other. However, the number of bits of each register is not limited to 8, and the number of shift registers is not limited to 4.

According to the pattern trigger type digital oscilloscope as an embodiment of the present invention, the wave pattern can be triggered, so that a desired wave portion can be easily observed.

The present invention is not limited to the particular embodiment described above. Various changes and modifications may be made within the spirit and scope of the invention. For example, the present invention can also be applied to various types of equipment such as digital storage oscilloscopes, waveform recorders, FFT analyzers and waveform analyzers, all adapting the digital signal processing techniques.

What is claimed is:

1. A waveform sequence trigger system comprising:
   comparing means for comparing an analog waveform input signal received with a predetermined threshold voltage to produce a serial analog signal having a high or low level;
   sampling means, connected to said comparing means, for sampling said serial analog signal with a predetermined clock to produce a serial digital signal;
   converting means, having serial shift registers of a predetermined bit number connected to said sampling means, for storing a predetermined bit portion of said serial digital signal while shifting it for each bit in accordance with a predetermined clock, and for converting data of a predetermined bit portion stored in said serial shift registers to a parallel digital signal;
   reference data setting means connected to said converting means, for presetting reference data corresponding to a waveform sequence of a desired time interval, to be triggered, of said analog waveform input signal received by the comparing means;
   first determining means, connected to said converting means and said reference data setting means, for determining a coincidence between said parallel digital signal and said reference data, and for counting a coincidence bit number as a result of a determination to thereby generate data representing said coincidence bit number;
   weight setting means for presetting a predetermined weighting coefficient associated with said coincidence bit number; and
   second determining means, connected to said first determining means and said weight setting means, for comparing said data representing said coincidence bit number with said predetermined weighting coefficient, and for generating a waveform sequence triggering signal when said coincidence bit number is equal to, or greater than, said predetermined weighting coefficient.

2. The waveform sequence trigger system according to claim 1, in which said converting means is comprised of a plurality of cascade-connected serial shift registers.

3. The waveform sequence trigger system according to claim 2, in which said first and second determining means each include a plurality of determining blocks corresponding to said plurality of cascade-connected serial shift registers, and
   said second determining means includes means for taking a logical product corresponding to a result of a determination relative to the respective determining blocks and for outputting said waveform sequence triggering signal.

4. The waveform sequence trigger system according to claim 1, in which said reference data contains a don't care signal.

5. An apparatus utilizing a waveform sequence triggering, comprising:
   analog/digital converting means for converting a received analog waveform input signal to a digital signal;
   comparing means for comparing said received analog waveform input signal with a predetermined threshold voltage to produce a serial analog signal having a high and a low level;
   sampling means, connected to said comparing means, for sampling said serial analog signal with a predetermined clock to produce a serial digital signal;
   converting means, having serial shift register of a predetermined bit number connected to said sampling means, for storing a predetermined bit portion of said serial digital signal while shifting it for each bit in accordance with a predetermined clock, and for converting data of a predetermined bit portion stored in said serial shift registers to a parallel digital signal;
   reference data setting means connected to said converting means, for presetting reference data corresponding to a waveform sequence of a desired time interval, to be triggered, of said received analog waveform input signal;
   first determining means, connected to said converting means and said reference data setting means, for determining a coincidence between said parallel digital signal and said reference data, and for counting a coincidence bit number as a result of a determination to thereby generate data representing said coincidence bit number;
   weight setting means for presetting a predetermined weighting coefficient associated with said coincidence bit number;
   second determining means, connected to said first determining means and said weight setting means, for comparing said data representing said coincidence bit number with said predetermined weighting coefficient, and for generating a waveform sequence triggering signal when said coincidence bit number is equal to, or greater than, said predetermined weighting coefficient; and
   memory means, connected to said analog/digital converting means and said second determining means, for storing said digital signal in accordance with said waveform sequence triggering signal.

6. The apparatus according to claim 5, further comprising processing means, connected to said memory means, for reading said digital signal from said memory means, and for subjecting it to a predetermined processing.

7. The apparatus according to claim 6, further comprising display means, connected to said processing means, for displaying an output signal from said processing means.

8. The apparatus according to claim 5, in which said converting means is comprised of a plurality of cascade-connected shift registers.

9. The apparatus according to claim 8, in which said first and second determining means each include a plurality of determining blocks to said corresponding plurality of cascade-connected shift register, and
   said second determining means includes means for taking a logical product corresponding to a result of a determination relative to the respective determining blocks, and for outputting said waveform sequence triggering signal.

10. The apparatus according to claim 5, in which said reference data contains a don't care signal.

* * * * *